United States Patent [19]

Latz et al.

[11] Patent Number: 5,006,219

[45] Date of Patent: Apr. 9, 1991

[54] MICROWAVE CATHODE SPUTTERING ARRANGEMENT

[75] Inventors: Rudolf Latz, Frankfurt am Main; Michael Scherer, Rodenbach; Michael Geisler, Wächtersbach; Michael Jung, Kahl, all of Fed. Rep. of Germany

[73] Assignee: Leybold Aktiengesellschaft, Hanau, Fed. Rep. of Germany

[21] Appl. No.: 413,863

[22] Filed: Sep. 28, 1989

[30] Foreign Application Priority Data

Jun. 24, 1989 [DE] Fed. Rep. of Germany ....... 3920834

[51] Int. Cl.$^5$ .............................................. C23C 14/35
[52] U.S. Cl. .......................... 204/298.16; 204/192.12; 204/298.19
[58] Field of Search ....................... 204/192.12, 298.16, 204/298.19

[56] References Cited

U.S. PATENT DOCUMENTS

| 4,422,896 | 12/1983 | Class et al. | 156/643 |
| 4,492,620 | 1/1985 | Matsuo et al. | 204/192.12 |
| 4,721,553 | 1/1988 | Saito et al. | 204/192.12 |
| 4,774,437 | 9/1988 | Helmer et al. | 315/111.81 |

FOREIGN PATENT DOCUMENTS

| 0103461 | 3/1984 | European Pat. Off. | 204/192.12 |
| 0154078 | 11/1985 | European Pat. Off. | |
| 0173164 | 3/1986 | European Pat. Off. | 204/298 |
| 0205028 | 12/1986 | European Pat. Off. | 204/298 |
| 0302684 | 1/1988 | European Pat. Off. | 204/192.11 |
| 3500328 | 10/1986 | Fed. Rep. of Germany. | |
| 3705666 | 1/1988 | Fed. Rep. of Germany. | |
| 3706698 | 1/1988 | Fed. Rep. of Germany. | |
| 3830478 | 7/1989 | Fed. Rep. of Germany | 204/192.11 |
| 3803355 | 8/1989 | Fed. Rep. of Germany. | |
| 3834984 | 4/1990 | Fed. Rep. of Germany. | |

OTHER PUBLICATIONS

D. M. Goebel et al., "Plasma Surface Interaction Experimental Facility (Pisces) for Materials and Edge Physics Studies," *Journal of Nuclear Materials*, vol. 121, (1984), pp. 277–282.

Patents Abstracts of Jan. 25, 1983, vol. 7, No. 19, C-147, (57-174466A).

K. Suzuki et al., "The Roles of Ions and Neutral Active Species in Microwave Plasma Etching," *Journal of Electrochemical Society: Solid-State Science and Technology*, Jun. 1979, vol. 126. No. 6, pp. 1024–1028.

*Primary Examiner*—Aaron Weisstuch
*Attorney, Agent, or Firm*—Fitch, Even, Tabin & Flannery

[57] ABSTRACT

The invention relates to a microwave cathode sputtering arrangement in which a cathode is disposed opposite a substrate. In the immediate vicinity of the substrate is located at least one magnetic field whose strength leads to an electron cyclotron resonance.

11 Claims, 1 Drawing Sheet

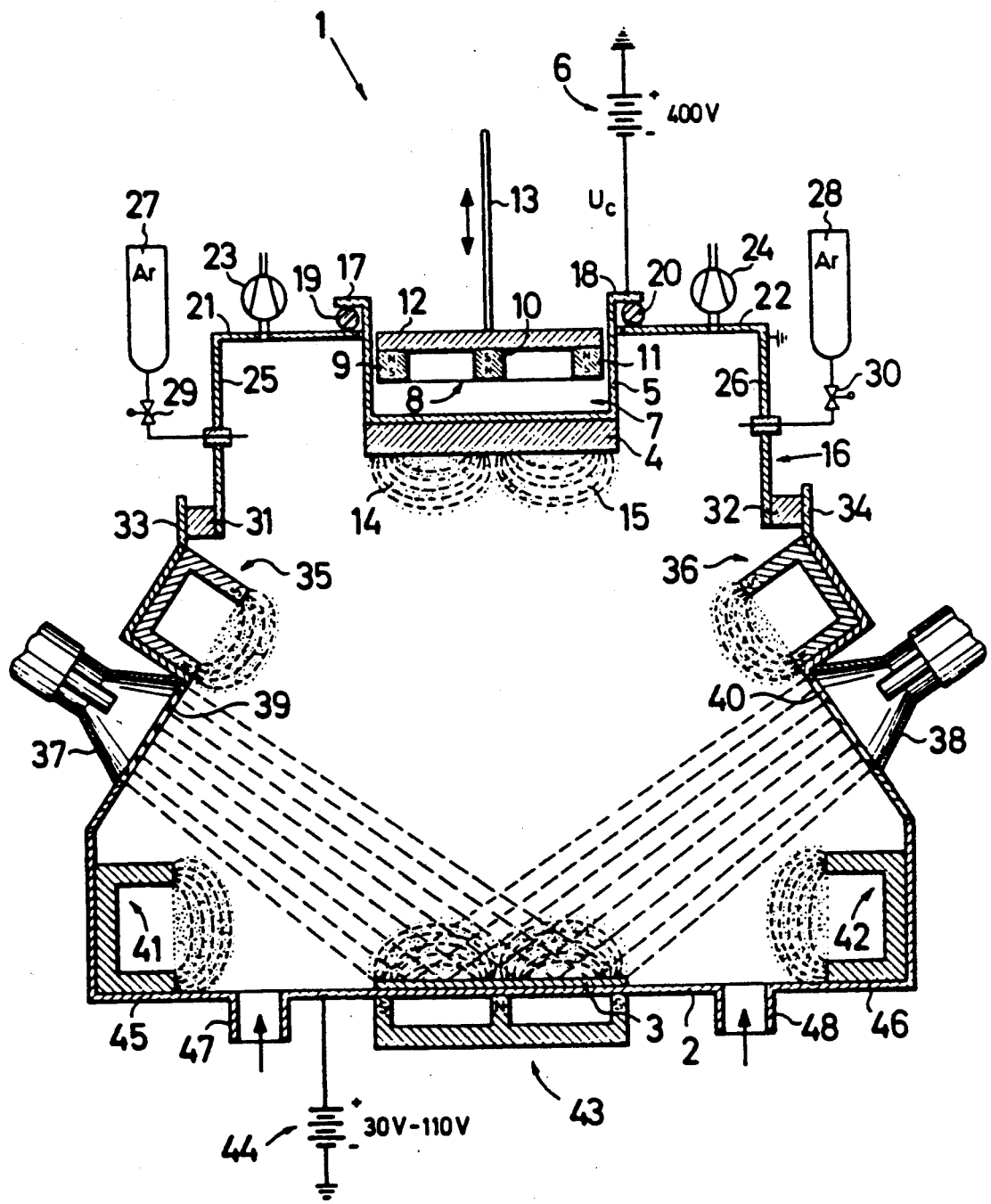

MICROWAVE CATHODE SPUTTERING ARRANGEMENT

The invention relates to a microwave cathode sputtering arrangement in which a cathode is disposed opposite a substrate.

BACKGROUND OF THE INVENTION

In numerous fields of technology it is required to apply very thin layers of pure substances on particular objects. Examples of this are window panes which are provided with a thin metal or metal oxide layer to filter out particular wavelength ranges from the sunlight. In the semiconductor technology, thin layers of a second substrate are applied onto a first substrate. It is particularly important in this technology that the thin layers are not only very pure but must also be apportioned very precisely so that the particular layer thicknesses are exactly reproducible in each instance.

Thin layers can be applied by chemical or electrochemical deposition, by vapor deposition in a vacuum or by "sputtering" or cathode disintegration. In cathode sputtering a gas discharge plasma, a substance to be sputtered on a cathode and a substrate to be coated are provided in a vacuum chamber.

An arrangement for applying thin layers on a substrate by means of the cathode sputtering method is already known in which a mechanical shutter is located between a cathode to be sputtered and an anode, the shutter dividing the space between the cathode and the substrate to be coated (EP-A-0 205 028). This arrangement, however, includes no microwave irradiation.

Futhermore, an arrangement for vapor deposition with the use of plasma is known, in which electrically charged particles are generated and the electrons are brought by means of a magnet into an electron cyclotron resonance (ECR) (EP-A-0 103 461). In this arrangement the ECR excitation takes place far removed from the substrate. Moreover, the magnetic field required for the establishement of the ECR condition is generated by means of an electromagnet of large volume.

A somewhat similar arrangement to provide ECR conditions using small and movable permanent magnets, is likewise known (DE-A-3 705 666). In this arrangement, however, no cathode sputtering is provided.

Further, a sputtering installation using microwaves is known in which the microwaves are irradiated in a direction perpendicular to an imaginary line extending between the target and the substrate (EP-A-0 173 164). In this sputtering installation, in addition, magnets are provided above the target and below the substrate, with the magnetic field of one magnet penetrating the target and the magnetic field of the other magnet penetrating the substrate. Since the microwaves in this sputtering installation are not directed onto the surface of the substrate, no substrate plasma is generated which is utilized for the reactive deposition by means of sputtering.

SUMMARY OF THE INVENTION

The invention is based on the task of decreasing the necessary reaction gas partial pressure required for the layer formation on the substrate to a level so that a reaction of the target material takes place only in the immediate vicinity of the substrate and not in the vicinity of the target.

Rate losses are suppressed with the invention since particles sputtered off the target form a compound with the reaction gas which is let in in the immediate vicinity of the substrate in a region located closely above the substrate. The sputtering rate, which is potentially very high can thus be fully utilized, to obtain a high deposition rate on the substrate. The arrangement according to the invention is suitable for the deposition of layers of oxides, nitrides, and other compounds, $Al_2O_3$, $Ta_2O_5$ or $SiO_2$ using Al, Ta or Si and oxygen as the reaction gas.

DESCRIPTION OF THE DRAWING

An embodiment example of the invention is represented in the FIGURE and is described in greater detail below.

DESCRIPTION OF THE INVENTION

In the FIGURE a diode sputtering arrangement 1 is shown which has a carrier 2 with a substrate 3 to be coated. Opposite the substrate 3 is a sputtering cathode 4 connected with a cathode holder device 5. The sputtering cathode 4 comprises a material which is sputtered by impinging ions and subsequently forms chemical compounds with other substances. To the cathode holder device 5 the negative potential of a DC current source 6 is connected which has for example a voltage $U_c = 400$ V. In a recess 7 of the cathode holder is located a magnet device 8 with three magnets 9, 10, 11 which are connected with each other via a yoke 12. The south poles of the magnets 9 and 11 and the north pole of the magnet 10 are oriented toward the sputtering cathode 4, while the north poles of the magnets 9 and 11 as well as the south pole of magnet 10 are connected with the yoke 12. On the yoke 12 is disposed a bar 13 with which the magnet device 8 can be moved toward the sputtering cathode 4 and away from it. If the magnet device 8 is in its lower position, i.e. if it lies virtually on the cathode holder device 5, then the magnetic field lines extend between the downward directed poles of magnets 9 to 11 as is indicated by reference numbers 14, 15.

The cathode holder device 5 is disposed in a coating chamber closed off by a housing 16 and rests with side flanges 17, 18 and via seals 19, 20 on the upper closure 21, 22 of this housing 16 which is electrically at ground. The upper closure 21, 22 is provided with vacuum pumps 23, 24 which evacuate the inner chamber of housing 16. At the upper side walls 25, 26 of housing 16 inlets for argon or other noble gases are provided which are fed into the coating chamber from argon containers 27, 28 via valves 29, 30. Supports 33, 34 for further magnets 35, 36 are joined to the upper side walls 25, 26 and electrically isolated from them by insulators 31, 32. These magnets 35, 36 are bipolar so as to have a magnetic field which is oriented toward the substrate 3 to be coated. Below these magnets 35, 36 are arranged microwave radiators 37, 38 which radiate microwaves through quartz disks 39, 40 onto the substrate 3. Further bipolar magnets 41, 42 are disposed laterally from substrate 3, below the microwave radiators 37, 38 so as to orient their magnetic field lines toward the substrate in directions parallel to the surface thereof.

A tripolar magnet 43 is provided immediately below substrate 3. Its arching field-line cover the entire substrate surface. The substrate carrier 2 is connected to the positive potential of a DC voltage source 44 which carries a DC voltage of approximately 30 V to 100 V. In the floor 45, 46 of housing 16 are provided inlet nozzles 47, 48 for the introduction of reaction gas.

With the device shown in the Figure it is possible to apply on the substrate 3 particular chemical compounds at high rates. These high rates are effected by a combination of the microwave irradiation with the electron cyclotron resonance. The magnetic field strengths of all permanent magnets 8, 35, 36, 41, 42, 43 shown in the Figure are so arranged that electron cyclotron resonance is generated. Through the orientation of the microwaves toward the substrate 3, a plasma densification takes place in the immediate vicinity of this substrate 3. The reactive gas partial pressure required for the layer formation is decreased to such a degree that target reaction with a suppressed rate loss is achieved. Consequently, a high sputtering rate of the target 4 can be exploited. Nearly any compound, for example oxides or nitrides can be deposited with DC current from the target 4 in the reactive atmosphere in front of the substrate 3.

What is claimed is:

1. Microwave cathode sputtering apparatus, comprising:
   a target having an active surface of material to be sputtered onto a substrate;
   a cathode connected to the target;
   means for mounting a substrate spaced from the target;
   magnet means for producing at least one magnetic field penetrating the target with curved field lines leaving and entering said target active surface;
   microwave source means generating microwaves directed toward the substrate and passing between the target and substrate so as to generate a plasma in the vicinity of the substrate; and
   magnetic field means in the vicinity of the substrate having a strength sufficient to produce electron cyclotron resonance in the plasma.

2. The apparatus of claim 1 wherein the magnetic field means include at least one magnet whose magnetic field is directed toward the substrate.

3. The apparatus of claim 2 wherein the magnetic field means includes a tri-polar magnet disposed below the substrate.

4. The apparatus of claim 2 wherein the magnetic field means includes two pairs of magnets disposed between the target and the substrate.

5. The apparatus of the claim 4 wherein the microwave source means comprise a pair of microwave radiators disposed between the two pairs of magnets.

6. The apparatus of claim 5 wherein one of the two pairs of magnets is disposed between the microwave radiators and the target and the other of the two pairs of magnets is disposed between the microwave radiators and the substrate.

7. The apparatus of claim 5 wherein the two pairs of magnets and the microwave radiators are arranged in mirror symmetry with respect to an imaginary axis passing through the substrate and the target.

8. The apparatus of claim 5 wherein the microwave radiators and the magnets of the two pairs of magnets are directed at the substrate so that their maximum microwave field strength and maximum magnetic field strength are oriented toward the substrate.

9. The apparatus of claim 1 wherein the magnet means includes a tri-polar magnet disposed above the target.

10. The apparatus of claim 1 wherein the microwave source means is oriented toward the substrate so as to have a maximum field strength directed at 45 degrees to the substrate surface.

11. The apparatus of claim 1 further comprising a reaction vessel having an upper end adjacent the target and a lower end adjacent the substrate, the reaction vessel including inlet means at the upper end for noble gases and inlet means in the lower end for reactive gases.

* * * * *